United States Patent [19]

Ohtsuka et al.

[11] Patent Number: 5,279,868
[45] Date of Patent: Jan. 18, 1994

[54] METHOD OF PREPARING ULTRAFINE PARTICLE DISPERSION MATERIAL

[75] Inventors: Shunsuke Ohtsuka; Hisao Nagata; Ken Yamashita; Tadashi Koyama; Shuhei Tanaka, all of Osaka, Japan

[73] Assignee: Nippon Sheet Glass Co., Ltd., Osaka, Japan

[21] Appl. No.: 953,800

[22] Filed: Sep. 30, 1992

[30] Foreign Application Priority Data

Oct. 9, 1991 [JP] Japan .................................. 3-261603

[51] Int. Cl.$^5$ .............................................. B05D 1/34
[52] U.S. Cl. ................................. 427/586; 427/196; 427/201; 427/250; 427/255.2; 427/255.3; 427/255.7; 427/561; 427/563; 427/595
[58] Field of Search ............... 427/561, 563, 586, 596, 427/250, 255.2, 255.3, 255.7, 196, 201

[56] References Cited

PUBLICATIONS

"Kagaku Sosetsu (=Chemical Reviews)" No. 48, 1985 Kotai Butsuri, vol. 24, p. 925 (1989).

Primary Examiner—Bernard Pianalto
Attorney, Agent, or Firm—Kanesaka and Takeuchi

[57] ABSTRACT

In the manufacture of ultrafine particles of semiconductor compound, pulse laser with high output is irradiated on an evaporation source having the same or similar composition as the above semiconductor compound to evaporate the source in a moment and the ultrafine particles of the semiconductor compound are produced utilizing the nuclear growth in inert gas. A process wherein a material for ultrafine particles is heated-/evaporated by laser in inert gas and the resulting vapor is rapidly cooled by a collision with the inert gas whereby the resulting ultrafine particles of said material is sticked on a base plate and another process wherein a material for matrix is heated/evaporated by laser whereby the matrix is formed on the base plate are carried out alternately so that the ultrafine particles are homogeneously dispersed in the matrix to prepare the material wherein the ultrafine particles are dispersed.

8 Claims, 4 Drawing Sheets

METHOD OF PREPARING ULTRAFINE PARTICLE DISPERSION MATERIAL

FIELD OF THE INVENTION

The present invention relates to a method of manufacturing ultrafine particles of semiconductor compound with large nonlinear optical effect used in ultrahigh speed optical switch or the like and also to a method of preparing a dispersion material of the particles.

DESCRIPTION OF THE RELATED ART

As to the manufacture of ultrafine particles in a gas-phase, a method of manufacturing them by evaporation of materials in gas has been known. The evaporation of materials in gas is a method utilizing an art that an evaporation source is heated at the temperature of not lower than the melting point by a continuous heating represented by resistance heating and the evaporated atoms or molecules generated thereby are precipitated into an inert gas atmosphere to give ultrafine particles and it has been used in the manufacture of ultrafine particles of metals or oxides. General characteristic features of the method are that any substance which evaporates can be made into ultrafine particles, particle size of the ultrafine particles can be controlled, and the resulting ultrafine particles are provided with good purity and crystallinity.

However, in the method of evaporation in gas by applying a continuous heating means such as resistance heating, decomposition of the material compound per se takes place during heating/evaporation if the difference in vapor pressure among the constituting elements of the material compound is large whereupon the control of stoichiometric ratio of the resulting ultrafine particles is difficult. Though the manufacture of ultrafine particles is not an object, the so-called flash vapor deposition wherein thin film is formed by a direct evaporation of the semiconductor compound has already been known as a control of the stoichiometric ratio. In that method, powdered material is dropped little by little into a crucible or the like kept at high temperature so that the material is heated and evaporated within very short period whereby thin film satisfying the stoichiometric ratio can be formed without the decomposition of the material compound per se.

However, even in that method, a decrease in purity of the crystals takes place by contamination with impurities from the crucible. Therefore the method is not suitable for the manufacture of ultrafine particles of semiconductor compound with large nonlinear optical effect.

Recently, it has been known that optical properties with high value of utilization such as an increase in nonlinear optical effect are provided for the ultrafine particles of semiconductor in a dispersed state wherein neither adhesion nor aggregation of the ultrafine particles takes place. However, when one wants to utilize the ultrafine particles in a dispersed state, it is quite essential to disperse and fix them in certain matrix with band gap larger than that of the desired semiconductor material. With regard to the semiconductor materials, polyelemental semiconductor compounds such as cadmium sulfide (CdS), cadmium telluride (CdTe) and gallium arsenic (GaAs) are expected as materials for achiving large nonlinear optical effects. Conditions necessary for an increase in nonlinear characteristics are such that the particle size causing the quantum size effect is not larger than several tens nm and the ultrafine particles have uniform size and, in addition, the concentration of the ultrafine particles when dispersed in the matrix is high.

Manufacture of sole ultrafine particles has been conducted in metals (e.g. aluminum, magnesium, iron and nickel), oxides (e.g. silicon oxide [$SiO_2$] and iron (III) oxide [$Fe_2O_3$]) and semiconductors (e.g. silicon [Si]). In manufacturing such ultrafine particles, many kinds of means such as already-mentioned resistance heating method, plasma heating method, high frequency induction heating method, electron beam heating method, spattering method, etc. have been used. Refer, for example, to "Kagaku Sosetsu (=Chemical Reviews)" No.48, 1985, Ultrafine Particles—Chemistry and Application, published by Gakkai Shuppan Center.

An example of preparation of dispersed material of ultrafine semiconductor which is very effective as a functional material is a method of melting followed by rapid cooling using glass as a matrix material. Refer, for example, to Junji Yumoto, et al: Kotai Butsuri, vol.24, page 925 (1989). Unlike the already-mentioned methods, ultrafine particles are not prepared solely but are prepared after melting with glass of the matrix.

Glass wherein ultrafine particles of semiconductor are dispersed and prepared by the method of melting followed by rapid cooling has been actually used already as a sharp cut filter having an absorption ability for certain wavelength region of light. Since such a filter contains ultrafine particles of semiconductor compound of particle size of about 10 nm, investigations for that have been conducted in recent years as a nonlinear optical material. Usual means for preparing glass wherein ultrafine particles of semiconductor is dispersed by the method is that semiconductor compound is melted together with glass material followed by rapid cooling and the resulting glass in which elements of the semiconductor compound are homogeneously dispersed is heated again whereupon fine particles are precipitated.

However, in many of the conventional methods for manufacturing ultrafine particles solely, the gist is fundamentally in the preparation of ultrafine particles and there is no idea of collecting them particularly in the matrix by means of dispersing. In other words, when conventional method of sole manufacture of ultrafine particles is used without any modification for the preparation of the materials wherein the ultrafine particles are dispersed in the matrix, it is necessary that the ultrafine particles are collected without aggregation but there are several problems to do that.

Moreover, in the method wherein the ultrafine particles are isolated in the matrix as in the above-mentioned method of melting followed by rapid cooling, there are disadvantages such as that impurities from the matrix are contained during the isolation of the ultrafine particles, that growing speed of each particle is different in the control of particle size by heating whereby the uniformalization of the size is difficult and that mixing concentration of the material is to be limited so as not to change the chemical property of the matrix per se whereby dispersing the ultrafine particles in high concentration is difficult.

OBJECT AND SUMMARY OF THE INVENTION

An object of the present invention is to offer a method of manufacturing ultrafine particles of semiconductor compound with desired composition preventing the decomposition of the material compound even in the case where the difference in the vapor pressure among the elements which constitute the material compound is large whereupon the problems in the manufacture of ultrafine particles of semiconductor compound in the conventional gas-phase method are solved.

Another object of the present invention is to offer a method of manufacturing ultrafine particles of semiconductor compound of high quality and with uniform particle size without contamination with impurities.

Still another object of the present invention is to offer a method of preparing a material in which ultrafine particles of uniform particle size are dispersed in high concentration without aggregation of the ultrafine particles whereupon the problems in the preparation of the material being dispersed with ultrafine particles of semiconductor compound as mentioned above are solved.

A method of manufacturing ultrafine particles of semiconductor compound in a gas-phase in accordance with the present invention is characterized in that, in manufacturing the ultrafine particles of semiconductor compound, the evaporation source having the same or similar composition as the above semiconductor compound has is irradiated with pulsed laser of high output having the wavelength absorbed by the material so that the material source is evaporated in a moment whereby the ultrafine particles of the semiconductor compound are formed by utilizing the growth of nucleus in inert gas.

In this method, pulse laser with high output is used as a technical means for production of ultrafine particles of semiconductor compound comprising the elements with large vapor pressure difference and also for production of ultrafine particles of semiconductor compound without decreases in purity of crystals and in crystallinity whereby the local heating of the evaporation source is carried out in a moment and noncatalytically.

In accordance with the method of manufacturing ultrafine particles of semiconductor compound of the present invention, heating/evaporation of the evaporation source takes place in a moment and, accordingly, evaporation within a state of keeping stoichiometric ratio is possible even in the case of a semiconductor compound comprising the elements with large difference in vapor pressure. Moreover, the heating takes place locally, i.e. only at the part where the laser is irradiated, and in a moment whereby changes in the composition of the evaporation source due to transfer of heat to the surrounding parts do not take place. Further, the heating is conducted not by a medium but by light and, therefore, there is no decrease in purity of the crystal by contamination with impurities whereby it is now possible to manufacture ultrafine particles of semiconductor compound of high quality.

The method of preparing the material wherein ultrafine particles are dispersed in accordance with the present invention is characterized in that a process in which a material for the ultrafine particles is evaporated by heating with laser in an inert gas, the resulting vapor is rapidly cooled by a collision with the inert gas and the resulting ultrafine particles of the material is sticked on the substrate and another process in which a material for matrix is evaporated by heating with laser so that the matrix is formed on the substrate are carried out alternately whereupon the ultrafine particles are homogeneously dispersed in the matrix.

Thus, the method of preparing a material in which the ultrafine particles are dispersed in accordance with the present invention utilizes a method wherein pulsed laser heating is applied for a gas-phase manufacture of ultrafine particles of semiconductor compound and also utilizes a fact that, when oxides, metals, carbides, nitrides, etc. absorb the laser energy, effective evaporation takes place as well. In the present invention, such a material on the substrate is sticked alternately with synthesis of the ultrafine particles to afford a material in which the ultrafine particles are dispersed. At that time, one kind of laser beam is irradiated on the semiconductor material and the matrix material alternately for evaporating them or, alternatively, different laser beams are irradiated on each of the semiconductor material and the matrix material alternately for evaporating them whereupon a material in which the ultrafine particles are dispersed is prepared. Further, the matrix material evaporated by heating with laser is made to react in a gas phase so that new matrix material which is different from the evaporation source is sticked on the substrate to afford a material in which ultrafine particles are dispersed.

In the method of preparing the material in which the ultrafine particles are dispersed in accordance with the present invention, synthesis of ultrafine particles and that of matrix are conducted one after another and, therefore, it is now possible to prevent the aggregation of the ultrafine particles. That has been difficult until now. Moreover, the concentration of the ultrafine particles in the dispersion can be freely changed by controlling the evaporating amount of the matrix. Furthermore, the particle size of the ultrafine particles can be controlled by adjusting the conditions for the synthesis of the ultrafine particles (e.g. pressure of the atmosphere) whereupon adjustment of the particle size is possible independently of the concentration of the dispersion. In addition, preparation of the ultrafine particles and that of matrix can be carried out independently and, therefore, range of choice for the materials for the ultrafine particles and the matrix becomes wider.

DESCRIPTION OF THE PREFERRED EMBODIMENTS

An example of the present invention will be explained by referring to the attached drawings.

Figure 1:
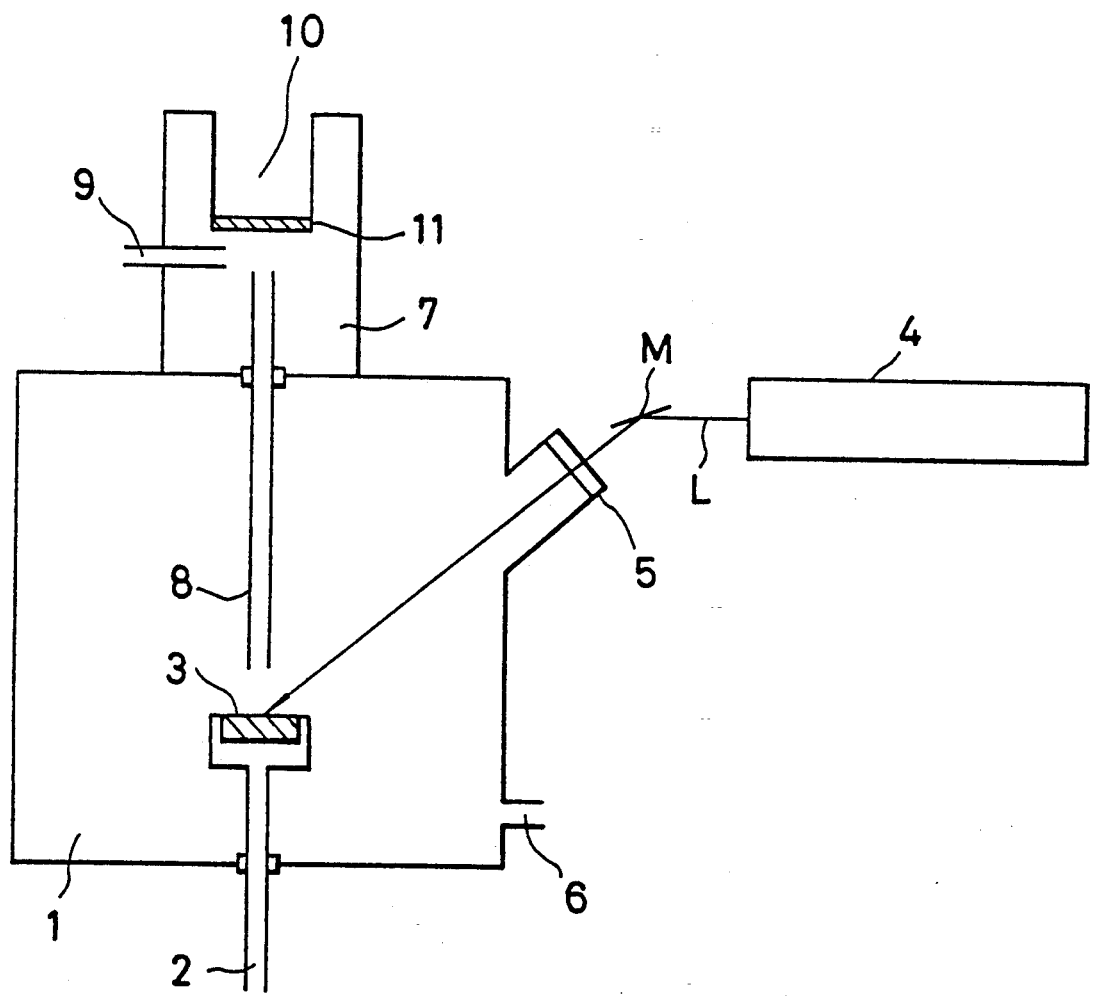
FIG. 1 is a brief cross section of the suitable apparatus for the gas-phase manufacture of ultrafine particles of the semiconductor compound in conducting the method of the present invention.

FIG. 1 is a brief cross sectin of the apparatus for the gas-phase manufacture of the ultrafine particles of the semiconductor compound suitable for conducting the present invention method.

In FIG. 1, there is a support 2 for the evaporation source (evaporation source 3 is placed on it) in a evaporation chamber 1. GaAs substrate of high purity was used as the evaporation source 3 for the manufacture of ultrafine particles of GaAs. Pulsed laser 4 with high output energy was placed outside the evaporation chamber 1 as a heat source and the laser beam L was introduced by a reflection of a mirror M from the window 5 equipped in the evaporation chamber 1 and irradiated to the evaporation source 3.

With regard to the wavelength of laser, absorption of laser energy takes place locally near the surface when shorter wavelength is used whereby only a part near the surface can be heated. On the contrary, when long wavelength is applied, heating is effected until deeper place though the temperature is low. In the case of GaAs, it has been known that As is removed at around 400° C. and it is recommended that a raise in temperature by conduction of heat to the nonmelted part where no laser is irradiated on the evaporation source 3 is suppressed as much as possible. Accordingly, in this example, second harmonics of 532 nm wavelength of Q switch, Nd: YAG laser was used as pulsed laser 4 with high output energy. With regard to energy of YAG laser, we confirmed that the output energy is to be at least 0.1 J/cm$^2$ for heating GaAs at higher than its melting point. Taking an opportunity of obtaining much more ultrafine particles into consideration, we made the output not less than 10 J/cm$^2$.

The support 2 for the evaporation source is equipped with a rotating mechanism so that the position for laser irradiation can be changed on the evaporation source 3. Ar gas was supplied from a gas inlet 6 so that growth of crystalline nucleus of semiconductor compound evaporated from the evaporation source 3 is accelerated whereby ultrafine particles of uniform particle size of not larger than 10 nm are produced. Particle size of the ultrafine particles becomes larger depending upon the distance between the evaporation source and the lower end of the collecting pipe. Therefore, control of the particle size was carried out by adjusting the distance between the evaporation source 3 and the lower end of the collecting pipe 8. Incidentally, the distance between the evaporation source 3 and the lower end of the collecting pipe 8 can be adjusted by moving the support 2 for the evaporation source up and down.

Evaporation chamber 1 and collecting chamber 7 were independently evacuated to make the difference in pressure of not less than $10^{-2}$ Torr. As a result of the difference in pressure, the inert gas supplied to the evaporation chamber 1 was sent to the collecting chamber 7, together with the produced ultrafine particles, through a collecting pipe 8 placed above the evaporation source 3. The ultrafine particles sent to the collecting chamber 7 was incorporated in organic solvent such as ethyl alcohol gushed from the gushing nozzle 9 for the organic solvent and coagulated and collected on a tetrafluorocarbon substrate 11 which was supercooled by being contacted with liquid nitrogen sink 10. Ultrafine particles of GaAs of 4-10 nm particle size were manufactured when the manufacturing conditions were that YAG laser output was 10-50 J/cm$^2$, pulse width was 10 ns, repeated frequency was 10 Hz, the pressure inside the evaporation chamber was $1 \times 10^{-2}$ Torr, the pressure inside the collecting chamber was $1 \times 10^{-4}$ Torr and the distance between the evaporation source and the lower end of the collecting pipe was 10-50 mm.

Though the manufacture of ultrafine particles of GaAs was described in this example, there is no limitation thereto but any of semiconductors comprising plural elements of group III-group V such as InP, InGaAs, etc. and those of group II-group VI such as CdS, ZnSe, CdSSe, etc. may be used for the manufacture of the same ultrafine particles.

Moreover, in this example, Ar gas was used as the gas to be supplied into the evaporation chamber but other inert gas such as He gas may be used as well.

Further, in this example, YAG laser was used as the pulsed laser with high output but, besides that, others such as excimer laser, ruby laser, etc. may be used too.

The most optimum pulsed laser conditions in the present invention are pulsed laser with high output of 10-50 J/cm$^2$ YAG laser output, 0.1-20 ns pulse width and 2-1000 Hz repeated frequency. Preferred pressure of the inert gas in the evaporating atmosphere is $10^{-6}$ to 10 Torr.

In accordance with the present invention, decomposition of compound per se and contamination of the ultrafine particles with impurities which are problems in the manufacture of ultrafine particles of semiconductor compound comprising elements with large vapor pressure difference can be prevented whereupon ultrafine particles of semiconductor compound of high quality with uniform particle size can be manufactured.

Then, a method of preparing a material in which the ultrafine particles are dispersed in accordance with the present invention will be illustrated by referring to FIG. 2 to FIG. 5.

Figure 2:
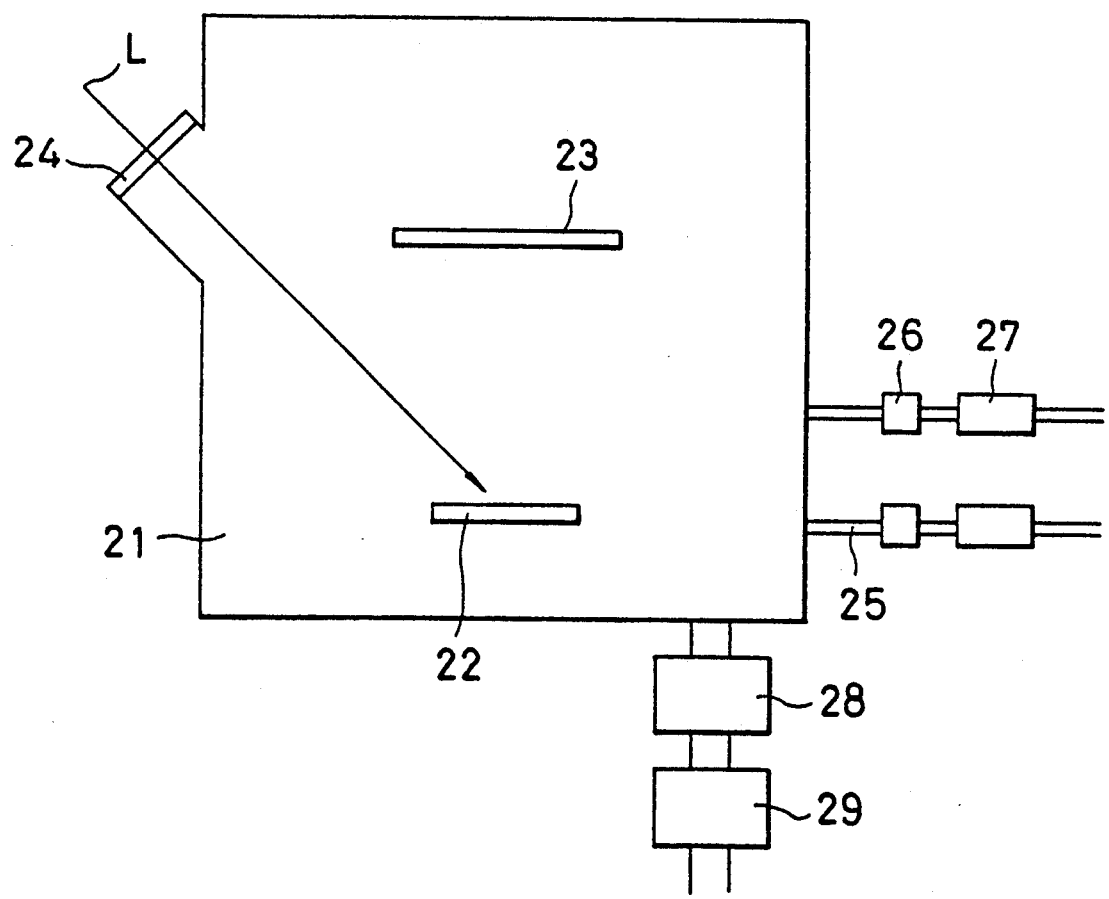
FIG. 2 is a scheme of the apparatus for the manufacture of glass in which ultrafine particles are dispersed as mentioned in the example of the present invention.

FIG. 2 shows an apparatus for preparing the material wherein the ultrafine particles are dispersed. As shown in FIG. 2, the apparatus is composed of a vacuum chamber 21 equipped with target holder 22 where the material for the ultrafine particles and silica glass are held, a substrate holder 23 where the substrate for accumulating the material wherein the ultrafine particles are dispersed is held, a window 24 for introducing laser beam L, a piple 25 for introducing gas, valve 26, mass flow controller 27, turbo molecular pump 28 for exhausting the gas and rotary pump 29. Target holder 22 and substrate holder 23 can be moved both up-and-down and revolvingly and, with regard to the movement of up and down, target holder 22 and substrate holer 23 can be synchronized by keeping their distance constant. The pulsed laser with high output which is a heating source for the material is YAG (yttrium-aluminum-garnet) laser with wavelength of 532 nm (second harmonic wave), pulse width of 10 ns and repeated frequency of 10 Hz and output of up to 200 mJ can be achieved.

Method of preparation of a material wherein ultrafine particles of CdTe are dispersed by using the above apparatus will be illutrated as hereunder. As materials for the ultrafine particles and the matrix, CdTe polycrystal wafer and sintered SiO powder absorbing the laser beam well were used, respectively. Those materials were held on the target holder 22 at the same time and the irradiated position of the laser is changed by revolving the holder. Quartz was used as the substrate.

Figure 3:
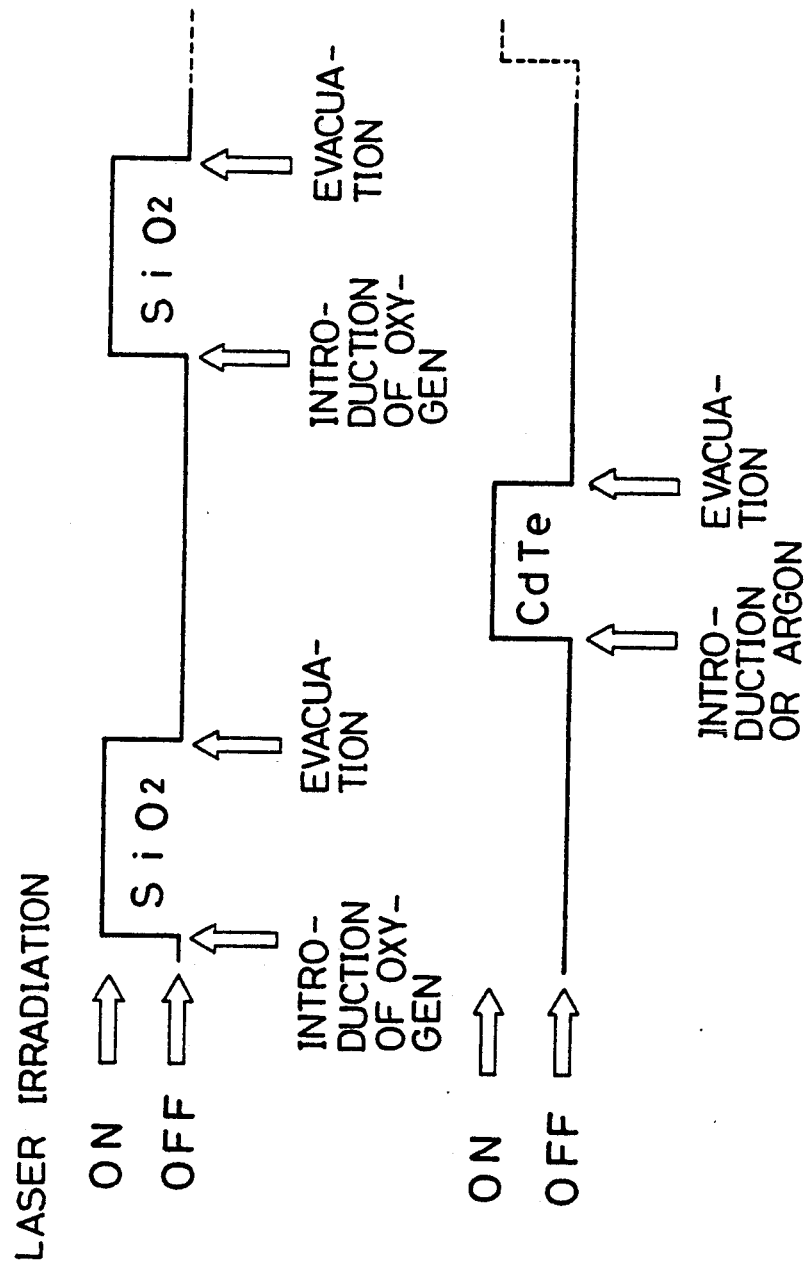
FIG. 3 is a timing chart for preparing the material in which ultrafine particles of CdTe are dispersed as mentioned in the example of the present invention.
Figure 4:
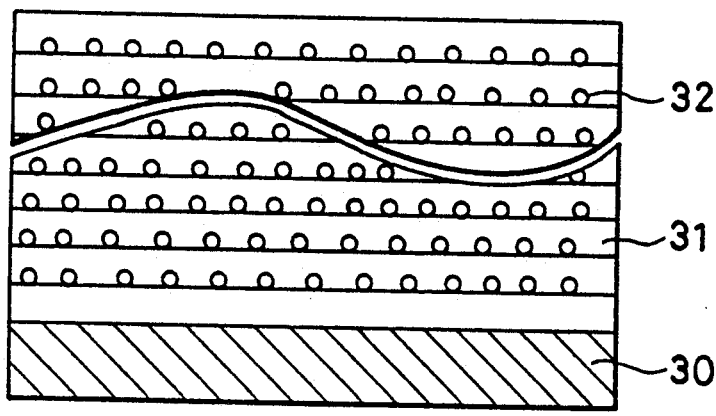
FIG. 4 is a scheme of the material in which ultrafine particles of CdTe are dispersed which is prepared in the example of the present invention.
Figure 5:
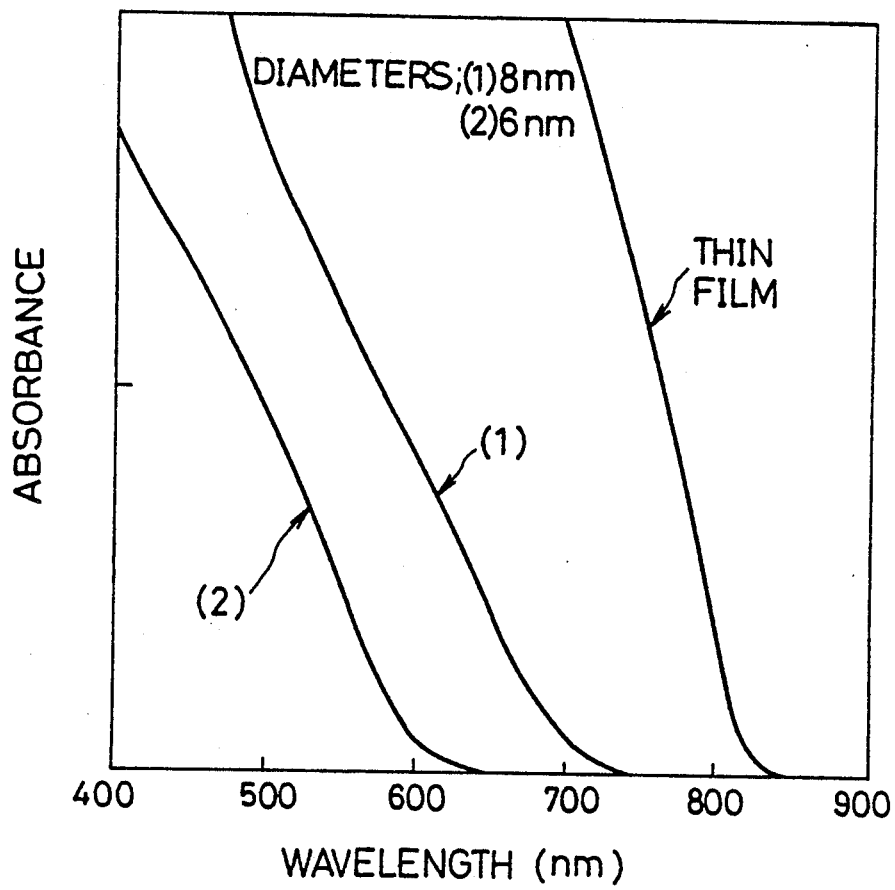
FIG. 5 is a graph showing the absorption characteristics of the glass in which ultrafine particles of CdTe are dispersed which is prepared in the example of the present invention.

SiO was evaporated in the vacuum chamber under the matrix preparing conditions of $5\times 10^{-4}$ Torr oxygen pressure and 25 J/cm$^2$ laser output whereupon homogeneous and noncrystalline SiO$_2$ (glass) film was formed on the quartz substrate placed at the position of 50 mm from the evaporation source. Shot numbers of the laser pulse during the preparation of the SiO$_2$ (glass) film was 20,000 and the film thickness was 500 nm. At that time, the quartz substrate was at room temperature. The resulting SiO$_2$ film was uncolored and transparent and, when checked by a spectrophotometer, no absorption of light was noticed within a range of 400–1,000 nm. Incidentally, it was confirmed that good SiO$_2$ film was prepared when the substrate was within a temperature range from room temperature to 450° C. With regard to the ultrafine particles of CdTe, they were directly deposited on a sample holder (carbon grid) of a transmission electron microscope (TEM) at the position of 50 mm from the evaporation source and the conditions for the preparing them were checked. As a result of the observation by means of TEM, it was confirmed that, when argon (Ar) gas pressure in the vacuum chamber was $3\times 10^{-6}$ to 20 Torr and laser output was 2.5–50 J/cm$^2$, crystalline ultrafine particles of 3–50 nm particle size were prepared. Based upon the above result, material wherein ultrafine particles of CdTe were dispersed was prepared. In accordance with the timing chart as shown in FIG. 3, 450 shots of laser pulse was irradiated in an oxygen atmosphere of $5\times 10^{-4}$ Torr as the first step to form SiO$_2$ (glass) film of 11.25 nm thickness on the quartz substrate. Then, as a second step, 50 shots of laser pulse was irradiated on CdTe polycrystall wafer in an argon atmosphere of $1\times 10^{-3}$ or 1 Torr whereby ultrafine particles of 6 nm or 8 nm, respectively, were sticked on the SiO$_2$ (glass) prepared in the first step under the state of no aggregation. The first and the second steps were repeated for 80 times to prepare the glass 31 wherein CdTe ultrafine particles 32 were dispersed (film thickness: ca. 1 μm) on the quarts substrate 30 as shown in FIG. 4. Chemical analysis of the resulting sample using an induction combination plasma spectroscopic analyzer (ICP) revealed that CdTe was dispersed in the glass in an amount of about 30% by weight. Result of evaluation of the absorption characteristics of this sample is shown in FIG. 5. It was found that, while the absorption edge of CdTe crystals in a thin film state was 820 nm, the resulting absorption edge was shifted to higher energy side due to the quantum size effect as compared with the above whereby good CdTe ultrafine particles (1),(2) were dispersed. In addition, concentrations and particle sizes can be well controlled with good reproducibility.

In this example, SiO which absorbs the second harmonic wave of YAG laser was evaporated in an oxygen atmosphere and the gas phase reaction with oxygen was utilized to prepare SiO$_2$ film. If, however, excimer laser is used as a heating source exclusively for the matrix, SiO$_2$ can be made into film by a vacuum evaporation.

In this example, glass wherein CdTe ultrafine particles were dispersed was mentioned. However, they are not limited to CdTe only but semiconductor of compounds of II-VI groups such as CdS, CdSSe, ZnSe, etc. and those of III-V groups such as GaAs, InP, InGaAs, etc. and also semiconductor single element such as Si may be used as ultrafine particles too. In addition, matrix material is not limited to silica glass but oxides (e.g. TiO$_2$ and Al$_2$O$_3$ and organic substances may be used as well. Some materials, however, do not absorb the YAG laser (532 nm) used here and, in that case, the third harmonic wave (354 nm) is used or other laser (e.g. excimer laser) is applied so that the material wherein ultrafine particle are dispersed can be prepared. Further, useful matrix can be prepared by evaporating metals (e.g. Ti and Al) in oxygen.

In accordance with the present invention, materials wherein ultrafine particles of semiconductors are dispersed in high concentrations in which the partize size is within a range of several nm to several tens nm and there is no aggregation among the particles can be easily prepared within short period. Furthermore, it is possible to prepare the ultrafine particles independently of the matrix and, therefore, controls of crystallinity and particle size distribution of the ultrafine particles are possible. In addition, out of the same reason, range of choosing the materials for matrix and ultrafine particles becomes wider. In view of the above, nonlinear optical materials with very high applicability can be offered. Moreover, due to the easiness in making into thin film, the product can be used as device material utilizing nonlinear optical effects.

What is claimed is:

1. A method of preparing a material with ultrafine particles dispersed therein, comprising:

heating by laser a material for ultrafine particles in an inert gas to evaporate the material as vapor, and rapidly cooling the vapor by colliding the vapor with the inert gas to thereby form the ultrafine particles and to deposit the ultrafine particles on a substrate, heating by laser a material for a matrix to evaporate the material, and depositing the matrix over the ultrafine particles, and repeating the heating and cooling steps to form the ultrafine particles, and the heating and depositing steps to form the matrix alternately so that the ultrafine particles are homogeneously dispersed in the matrix.

2. A method of claim 1, wherein the material for the matrix sufficiently absorbs energy of the laser by selecting the material or wavelength of the laser.

3. A method of claim 1, wherein said material for the matrix heated by laser is deposited directly over the ultrafine particles or is reacted with a material in a gas phase so that a reacted material is deposited over the ultrafine particles.

4. A method of claim 1 wherein the laser is pulsed laser with high output.

5. A method of claim 1 wherein the laser with high output is a laser with output of 0.01–200 J/cm$^2$, pulse width of 0.1–20 ns and repeated frequency of 2–1,000 Hz.

6. A method of claim 1 wherein the matrix is glass, metal oxide or metal.

7. A method of claim 1 wherein the ultrafine particles are semiconductor polyelemental compound of elements of group III-group V or that of elements of group II-group VI.

8. A method of claim 7 wherein the ultrafine particles are GaAs, InP, InGaAs, CdS, ZnSe or CdSSe.

* * * * *